(12) United States Patent
Shreeram et al.

(10) Patent No.: US 10,964,475 B2
(45) Date of Patent: Mar. 30, 2021

(54) FORMATION OF A CAPACITOR USING A SACRIFICIAL LAYER

(71) Applicant: Micron Technology, Inc., Boise, ID (US)

(72) Inventors: Devesh Dadhich Shreeram, Boise, ID (US); Sevim Korkmaz, Boise, ID (US); Jian Li, Boise, ID (US); Sanjeev Sapra, Boise, ID (US); Dewali Ray, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 16/258,904

(22) Filed: Jan. 28, 2019

(65) Prior Publication Data

US 2020/0243258 A1    Jul. 30, 2020

(51) Int. Cl.
*H01L 49/02*    (2006.01)
*H01G 4/008*    (2006.01)
*H01G 4/08*    (2006.01)

(52) U.S. Cl.
CPC ............. *H01G 4/008* (2013.01); *H01G 4/08* (2013.01); *H01L 28/91* (2013.01); *H01L 28/92* (2013.01)

(58) Field of Classification Search
CPC ............. H01L 29/945; H01L 29/66181; H01L 28/90–92; H01L 27/10861; H01L 27/10829
See application file for complete search history.

(56) References Cited

U.S. PATENT DOCUMENTS

| 7,662,693 | B2  | 2/2010 | Bhattacharyya |
| 7,696,056 | B2* | 4/2010 | Kiehlbauch ....... H01L 27/10894 438/396 |
| 7,875,529 | B2  | 1/2011 | Forbes et al. |
| 7,875,733 | B2  | 1/2011 | Forbes et al. |
| 7,892,937 | B2* | 2/2011 | Rana ................. H01G 4/33 438/396 |
| 8,274,777 | B2  | 9/2012 | Kiehlbauch |
| 8,518,788 | B2* | 8/2013 | Lee .................. H01L 27/10852 438/381 |
| 8,946,043 | B2* | 2/2015 | Greeley ........... H01L 27/10861 438/381 |
| 9,076,680 | B2* | 7/2015 | Busch ................. H01L 28/91 |

(Continued)

*Primary Examiner* — Laura M Menz
*Assistant Examiner* — Khatib A Rahman
(74) *Attorney, Agent, or Firm* — Brooks, Cameron & Huebsch, PLLC (57) ABSTRACT

Methods, apparatuses, and systems related to forming a capacitor using a sacrificial material are described. An example method includes forming a first silicate material on a substrate. The method further includes forming a first nitride material on the first silicate material. The method further includes forming a second silicate material on the first nitride material. The method further includes forming a second nitride material on the second silicate material. The method further includes forming a sacrificial material on the second nitride material. The method further includes forming a column of capacitor material through the first silicate material, the first nitride material, the second silicate material, the second nitride material, and the sacrificial material. The method further includes removing the sacrificial material to expose a top portion of the capacitor material.

24 Claims, 9 Drawing Sheets

(56) References Cited

U.S. PATENT DOCUMENTS

| | | | | |
|---|---|---|---|---|
| 9,496,266 B2* | 11/2016 | Kim | | H01L 28/90 |
| 2005/0054159 A1* | 3/2005 | Manning | | H01L 27/10852 |
| | | | | 438/253 |
| 2006/0046420 A1* | 3/2006 | Manning | | H01L 27/10852 |
| | | | | 438/396 |
| 2006/0134854 A1* | 6/2006 | Park | | H01L 27/10852 |
| | | | | 438/239 |
| 2006/0261440 A1* | 11/2006 | Manning | | H01L 28/90 |
| | | | | 257/532 |
| 2007/0045693 A1* | 3/2007 | Manning | | H01L 28/91 |
| | | | | 257/296 |
| 2007/0123017 A1* | 5/2007 | Sadjadi | | H01J 37/32623 |
| | | | | 438/597 |
| 2007/0238259 A1* | 10/2007 | Bhat | | H01L 28/91 |
| | | | | 438/381 |
| 2008/0206950 A1* | 8/2008 | Bhat | | H01L 28/91 |
| | | | | 438/397 |
| 2008/0315438 A1* | 12/2008 | Mahler | | H01L 23/29 |
| | | | | 257/782 |
| 2009/0047769 A1* | 2/2009 | Bhat | | H01L 27/10852 |
| | | | | 438/387 |
| 2009/0212338 A1* | 8/2009 | Benson | | H01L 28/91 |
| | | | | 257/306 |
| 2009/0275185 A1* | 11/2009 | Shea | | H01L 28/91 |
| | | | | 438/381 |
| 2010/0009512 A1* | 1/2010 | Fishburn | | H01L 27/10817 |
| | | | | 438/399 |
| 2010/0047992 A1* | 2/2010 | Kuan | | H01L 28/90 |
| | | | | 438/397 |
| 2010/0065531 A1* | 3/2010 | Kiehlbauch | | H01L 21/31144 |
| | | | | 216/41 |
| 2010/0266962 A1* | 10/2010 | Fishburn | | H01L 27/10817 |
| | | | | 430/319 |
| 2012/0040507 A1* | 2/2012 | Lee | | H01L 27/10817 |
| | | | | 438/381 |
| 2013/0029487 A1* | 1/2013 | Sako | | H01L 21/76898 |
| | | | | 438/666 |
| 2015/0348963 A1* | 12/2015 | Hung | | H01L 27/10852 |
| | | | | 257/532 |
| 2016/0020212 A1* | 1/2016 | Kim | | H01L 28/90 |
| | | | | 438/666 |

* cited by examiner

FORMATION OF A CAPACITOR USING A SACRIFICIAL LAYER

TECHNICAL FIELD

The present disclosure relates generally to semiconductor devices and methods, and more particularly to formation of a capacitor using a sacrificial layer.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Various types of memory devices (e.g., those that include volatile or non-volatile memory cells) may include rectilinear trenches and/or round, square, oblong, etc., cavities that may be formed into a sidewall structural material as openings. Such openings may contain, or be associated with, various materials that contribute to data access, storage, and/or processing, or to various support structures, on the memory device. As an example, capacitor material may be deposited into these openings to provide the data access, storage, and/or processing.

In order to increase the capacitance of a cell of the memory device, a surface area of the capacitor material formed into a column can be increased by increasing the height of the capacitor material column within the opening. However, due to possible gap margins and smaller pitch, increasing the height of a capacitor column can increase the risk of bending and wobbling of the capacitor column, causing possible shorts.

In order to mitigate this issue, a method for forming a capacitor using a sacrificial layer is described further below.

As an example, a capacitor can include a mid lattice portion and top lattice portion including oxides (TEOS and BPSG) in between the mid lattice and top lattice portions. This dual lattice structure can include an amount of recess material (e.g., a sacrificial layer of Nitride or Oxide) above the top lattice. Positioning a sacrificial layer above a top lattice can reduce bending of the capacitors by reducing stress on the BPSG/TEOS of the lattice portions.

The present disclosure includes methods, apparatuses, and systems related to forming a capacitor using a sacrificial layer. An example of a method described herein includes forming a pillar on a substrate material. The pillar includes a number of layers of silicate material, a number of layers of nitride material, and a sacrificial layer on a top portion of the pillar. The example method further includes depositing a column of nitride material between the pillar and an adjacent pillar and removing the sacrificial layer.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 112 may reference element "12" in FIG. 1, and a similar element may be referenced as 212 in FIG. 2. In some instances, a plurality of similar, but functionally and/or structurally distinguishable, elements or components in the same figure or in different figures may be referenced sequentially with the same element number (e.g., 124-1, 124-2, 124-3, 124-4, 124-5 in FIG. 1).

Figure 1:
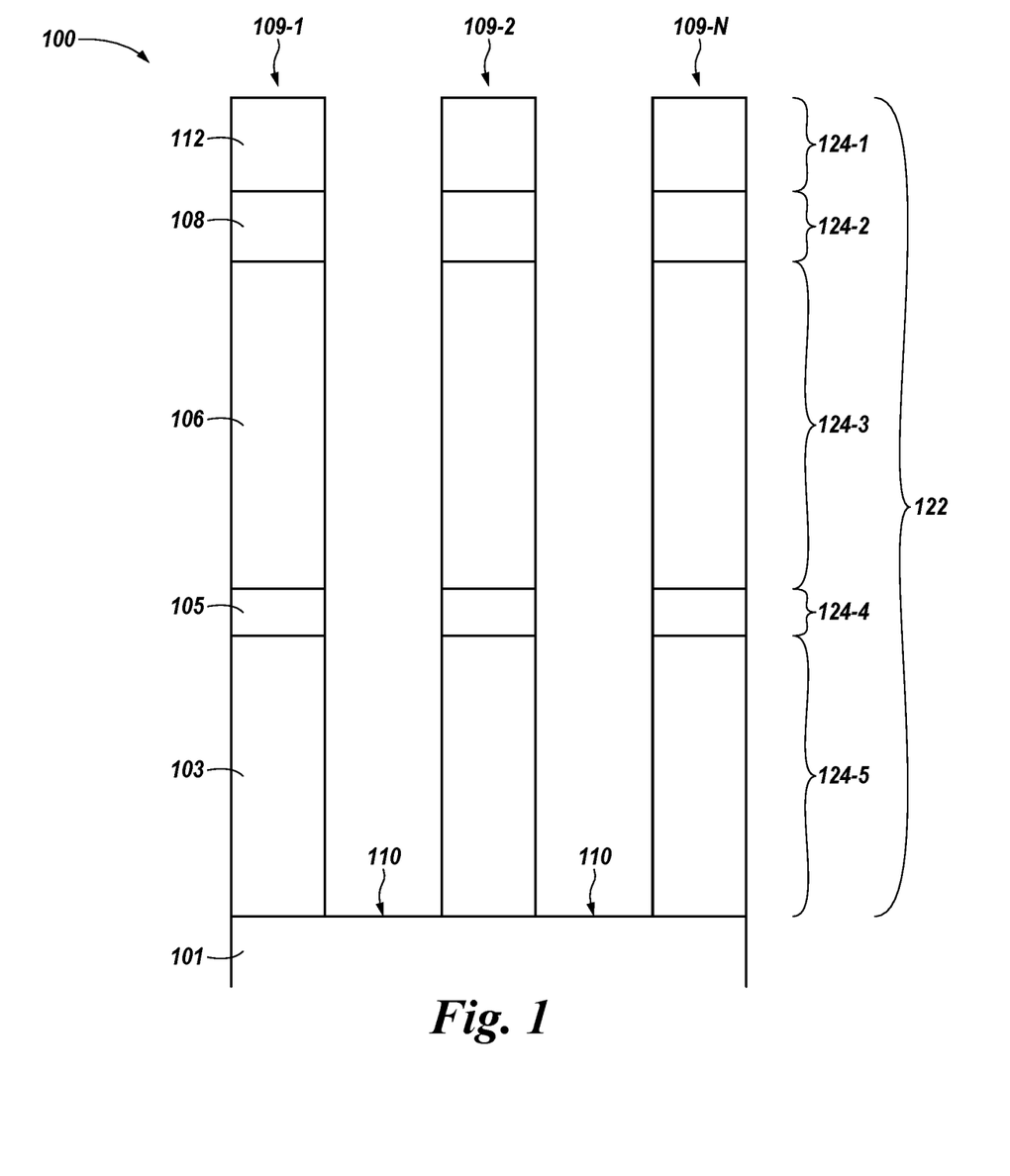
FIGS. 1-6 illustrate cross-sectional views of a portion of an example memory device at stages of an example fabrication sequence for formation of a plurality of pillars of capacitors using a sacrificial layer in accordance with a number of embodiments of the present disclosure.

FIG. 1 illustrates a cross-sectional view 100 of a portion of an example memory device at a particular stage in an example semiconductor fabrication sequence for forming a capacitor using a sacrificial layer in accordance with a number of embodiments of the present disclosure. The example memory device 100 can include a plurality of pillars 109-1, 109-2, . . . , 109-N (hereinafter referred to collectively as plurality of pillars 109). Each of the plurality of pillars 109 can include a first silicate material 103, shown to have been formed over an underlying substrate material 101. The substrate material 101 may be formed from various undoped or doped materials on which memory device materials may be fabricated. Examples of a relatively inert undoped substrate material 101 may include monocrystalline silicon (monosilicon), polycrystalline silicon (polysilicon), and amorphous silicon, among other possibilities.

The first silicate material 103 may, in a number of embodiments, have been formed from a borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material 103, as described herein.

The first silicate material 103 may be originally formed (e.g., deposited) as a single layer on a surface 110 of the underlying substrate material 101. For example, the first silicate material 103 may be formed without an opening formed therein from an upper surface of the first silicate material 103 to the surface 110 of the underlying substrate material 101. The single layer of the first silicate material 103 may, in a number of embodiments, be deposited to a thickness in a range of from around 400 nanometers (nm) to around 750 nm above the surface 110 of the underlying substrate material 101.

A first nitride material 105 is shown to have been formed over a surface of the first silicate material 103 opposite from the underlying substrate material 101. The first nitride material 105 may be formed (e.g., deposited) as a single layer on an upper surface of the first silicate material 103. Alternatively, the first nitride material 105 may be formed (e.g., deposited) as two separate portions (e.g., layers) on the upper surface of the first silicate material 103. For example, the first silicate material 103 may be formed with an opening (such as the opening illustrated between materials 109-1 and 109-2 in FIG. 1, illustrated as pillars in this 2-dimensional format but not necessarily pillars in a 3-dimensional format, for example) formed therein from an upper surface of the first nitride material 105 to an upper surface of the first silicate material 103.

The first nitride material 105 may be formed from a nitride material selected for dielectric or resistance properties. For example, one or more dielectric and/or resistor nitrides may be selected from boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material 105. The first nitride material 105 may, in a number of embodiments, be deposited to a thickness in a range of from around 15 nm to around 30 nm above the surface of the first silicate material 103.

A second silicate material 106 is shown to have been formed over a surface of the first nitride material 105 opposite from the first silicate material 103. The second silicate material 106 may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

A second nitride material 108 is shown to have been formed over a surface of the second silicate material 106 opposite from first nitride material 105. The second nitride material 108 may be formed (e.g., deposited) as a single layer on an upper surface of the second silicate material 106.

Similar to the first nitride material 105, the second nitride material 108 may be formed from a nitride material selected for dielectric or resistance properties. For example, one or more dielectric and/or resistor nitrides may be selected from BN, $SiN_X$, $Si_3N_4$, AlN, GN, TaN, $Ta_2N$, TiN, $Ti_2N$), and WN, $W_2N$, $WN_2$, among other possibilities, for formation of the second nitride material 108. In various embodiments, the first nitride material 105 and the second nitride material 108 may be formed from a same single nitride or a same mixture of nitrides or the first and second nitride materials 105, 108 each may be formed from a different single nitride or a different mixture of nitrides dependent upon, for example, various uses to which the nitrides may be applied. The second nitride material 108 may, in a number of embodiments, be deposited to a thickness in a range of from around 80 nm to around 150 nm above the surface of the second silicate material 106.

A sacrificial material 112 may be formed over a surface of the second nitride material 108 opposite from the second silicate material 106. In at least one embodiment, the sacrificial material 112 may be a third nitride material. In at least one embodiment, the sacrificial material 112 can be a different nitride material than the second nitride material 108. In at least one embodiment, the sacrificial material 112 can be a same nitride material than the second nitride material 108.

Similar to the first nitride material 105 and the second nitride material 108, the sacrificial material 112 may be formed from a nitride material selected for dielectric or resistance properties. For example, one or more dielectric and/or resistor nitrides may be selected from BN, $SiN_X$, $Si_3N_4$, AlN, GN, TaN, $Ta_2N$, TiN, $Ti_2N$), and WN, $W_2N$, $WN_2$, among other possibilities, for formation of the sacrificial material 108. In various embodiments, the first nitride material 105, the second nitride material 108, and the sacrificial material 112 may be formed from a same single nitride or a same mixture of nitrides or the first and second nitride materials 105, 108 and the sacrificial material 112 each may be formed from a different single nitride or a different mixture of nitrides dependent upon, for example, various uses to which the nitrides may be applied. The sacrificial material 112 may, in a number of embodiments, be deposited to a thickness in a range of from around 80 nm to around 150 nm above the surface of the second nitride material 108.

An etch process (e.g., a first wet etch process or dry etch process) may be utilized to etch via (e.g., through) the sacrificial material 112, the second nitride material 108, the second silicate material 106, the first nitride material 105, and/or the first silicate material 103 to form an opening within the previously listed materials (as is illustrated already between materials 109-1 and 109-2). Performance of the etch process may result in formation of an opening within any combination of the materials 109-1 in order to form a resultant opening that extends from the upper surface of the sacrificial material 112 to the surface 110 of the substrate material 101. The resultant opening may have a height 122 in a range of from around 8,000 Angstroms (or 800 nm) to around 15,000 Angstroms (or 1,500 nm). Each of the materials can contribute a particular height to the overall height 122 of the structure. As an example, the first silicate material 103 can be a height 124-5, the first nitride material can be a height 124-4, the second silicate material 106 can be a height 124-3, the second nitride material 108 can be a height 124-2, and the sacrificial layer 112 can be a height 124-1, that, when added together, results in the overall height 122.

In some embodiments, the height 124-5 of the first silicate material 103 can be one of 4800 Angstroms, 5000 Angstroms, 5300 Angstroms, 5700 Angstroms, and/or within a range from 3000-7000 Angstroms. In some embodiments, the height 124-4 of the first nitride material 105 can be one of 100 Angstroms, 200 Angstroms, 300 Angstroms, and/or within a range from 100-500 Angstroms. In some embodiments, the height 124-3 of the second silicate material 106 can be one of 4800 Angstroms, 5000 Angstroms, 5300 Angstroms, 5700 Angstroms, and/or within a range from 3000-7000 Angstroms. In some embodiments, the height 124-2 of the second nitride material 108 can be one of 200 Angstroms, 400 Angstroms, 800 Angstroms, and/or within a range from 200-1500 Angstroms. In some embodiments, the height 124-2 of the sacrificial material 112 can be one of 200 Angstroms, 400 Angstroms, 700 Angstroms, 800 Angstroms, and/or within a range from 200-1500 Angstroms.

In at least one embodiment, the width or diameter of the opening between materials 109-1 and 109-2 can be within in a range of from around 200-600 Angstroms (or 20 to 60 nm) and the height of the opening can be within a range of from around 8,000-15,000 Angstroms (800-1,500 nm) and may result in an aspect ratio (AR) of the height to width being in a range of from around 25:1 to around 50:1 as the etch progresses through the first silicate material 103 and approaches the substrate material 101.

As the height 122 of the materials 109-1 to 109-N increases, a bending and/or leaning of the materials 109 can occur. In some embodiments, a support structure may be formed for the second silicate material 106 stacked on the first silicate material 103 adjacent the substrate material 101 in order to minimize this bending and/or leaning. The support structure may, in a number of embodiments, be formed by forming (e.g., depositing) the first nitride material 105 between the first silicate material 103 and the second silicate material 106 and forming the second nitride material 108 on an opposite surface of the second silicate material 106. The first and second nitride materials 105, 108 may form the support structure by extending between and connecting (e.g., attaching) to features associated with multiple capacitors (e.g., as shown and described in connection with FIGS. 4-6) or other structural elements of the example memory device. A support structure formed as such may enable a stack of the first and the second silicate materials 103, 106 to be maintained in a more static configuration relative to each other and the underlying substrate material 101 than provided by the first and the second silicate materials 103, 106 themselves.

However, this support structure may minimize an amount of surface area for contact with a capacitor, thereby decreasing efficiency of the capacitor. In order to prevent this, a sacrificial material 112 can be applied in order to provide a structure for increasing the height of the capacitor and subsequently being removed in order to increase a surface area of contact of the capacitor, as will be described further in association with FIGS. 2-6.

Figure 2:
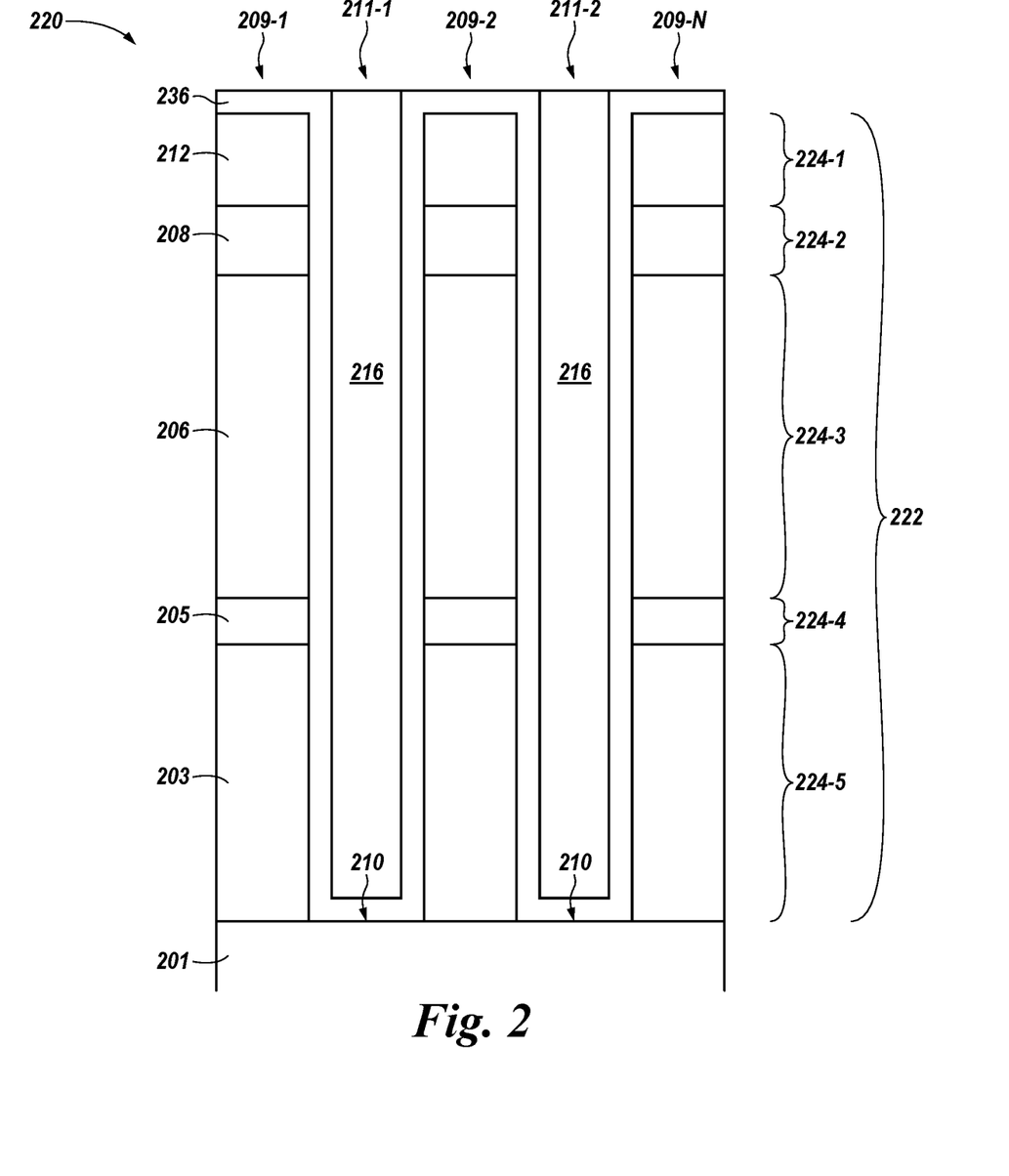

FIG. 2 illustrates a cross-sectional view 220 of a portion of an example memory device at a particular stage in an example fabrication sequence for formation of a capacitor in association with an opening in accordance with a number of embodiments of the present disclosure. FIG. 2 illustrates a structure of the portion of the example memory device at a stage in time following completion of the fabrication sequence described in connection with FIG. 1.

As described in connection with FIG. 1, a first nitride material 205 may be formed (e.g., deposited) between the first silicate material 203 and the second silicate material 206. A second nitride material 208 also may be formed (e.g., deposited) on a second silicate material 506 and a sacrificial material 212 may be formed (e.g., deposited) on the second nitride material 208. An opening 211-1 between materials 209-1 and 209-2 may extend from the substrate material 201 to the sacrificial layer 212. For clarity in the example fabrication sequence, FIG. 2 shows a first opening 211-1 and a second opening 211-1 in the portion of the example memory device, although embodiments are not limited to two openings and may include any number of such openings.

As shown in FIG. 2, a first electrode material 236 has been formed (e.g., deposited) on the surface 210 of the substrate material 201 and on the sidewalls of the openings 211-1 and 211-2. In a number of embodiments, the first electrode material 236 also may have been formed over the upper surface of the second nitride material 208. As is illustrated in FIG. 2, a capacitor material 216 is shown as having been formed (e.g., deposited) to fill the openings 211-1, 211-2 from the substrate material 201 to a height 222 of the opening 211 at the upper surface of the second nitride material 208. Each of the materials can contribute a particular height to the overall height 222 of the structure. As an example, the first silicate material 203 can be a height 224-5, the first nitride material can be a height 224-4, the second silicate material 206 can be a height 224-3, the second nitride material 208 can be a height 224-2, and the sacrificial layer 212 can be a height 224-1, that, when added together, results in the overall height 222.

In a number of embodiments, the capacitor material 216 may be deposited to fill the openings 211-1, 211-2 to an upper surface of the first electrode material 236. The first electrode material 236 and the capacitor material 216 may be formed from any conductive materials and to any width (e.g., thickness) usable in association with formation of an operable capacitor for a semiconductor device.

Figure 3:
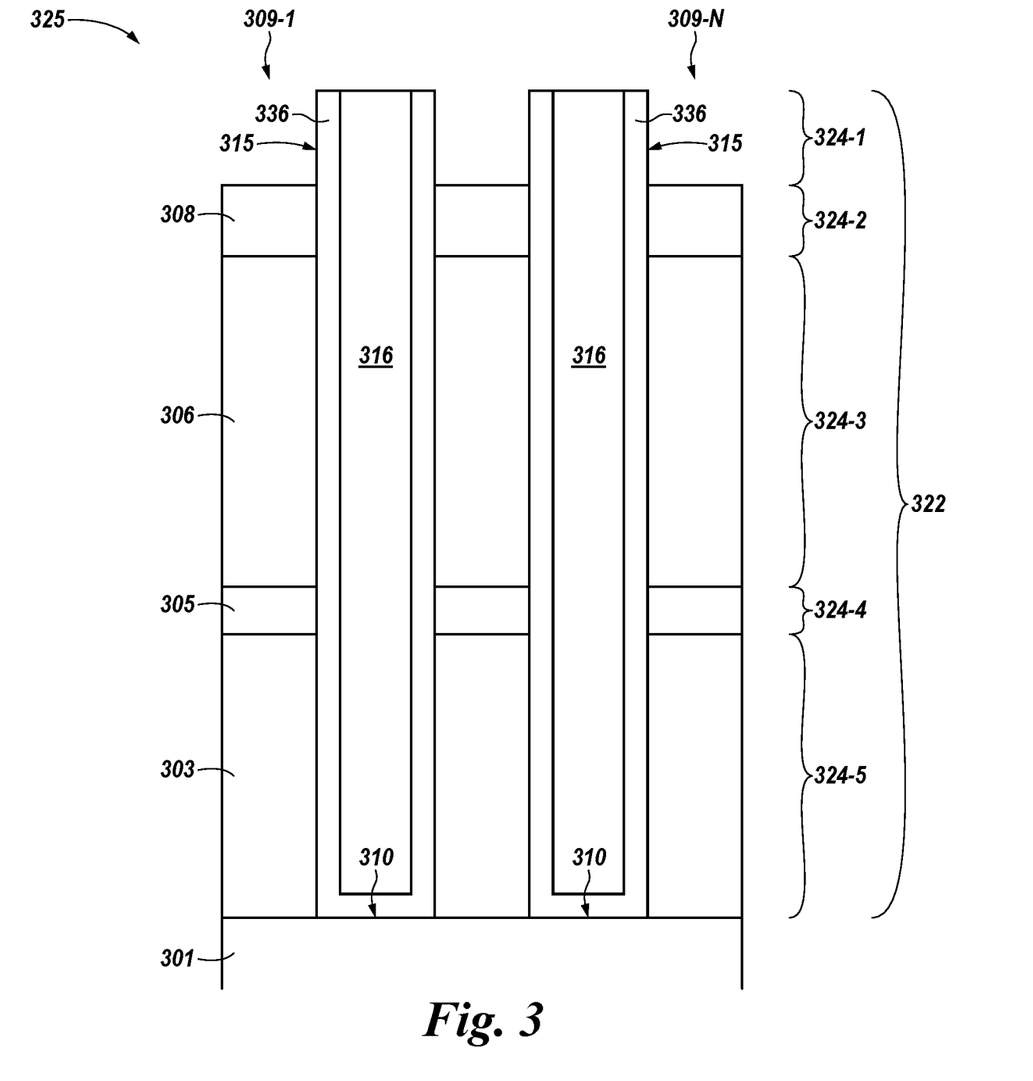

FIG. 3 illustrates a cross-sectional view 325 of a portion of an example memory device at a particular stage in the example fabrication sequence for formation of a capacitor in accordance with a number of embodiments of the present disclosure. FIG. 3 illustrates a structure of the portion of the example memory device at the particular stage following completion of the example fabrication sequence described in connection with FIGS. 1-2.

As shown in FIG. 3, the sacrificial material (e.g., sacrificial material 112 in FIGS. 1 and 212 in FIG. 2) has been removed from the portion of the example memory device shown in FIG. 2. The sacrificial material may be removed with (via application of) a solvent that is selective for removing (e.g., dissolving) the sacrificial material from the memory device while not removing (e.g., leaving) other materials such that those materials remain in the memory device (such as not removing the first silicate material 303, the first nitride material 305, the second silicate material 306, and the second nitride material 308). Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities. Removal of the sacrificial material may leave empty spaces (e.g., voids) in the structure of the memory device that expose a top portion 315 of the first electrode material 336, thereby increasing an exposed surface area of the first electrode material 336.

In contrast, the application of the selective solvent may leave the capacitor material 316 having the first electrode material 336 formed over an outer surface thereof remaining in the structure of the memory device. In addition, the first silicate material 303, the first nitride material 305, the second silicate material 306, and the second nitride material 308 may be left remaining following the application of the selective solvent, among other possible components or structural features that may remain in the structure of the memory device.

As is illustrated in FIG. 3, the first silicate material 303 can be a height 324-5, the first nitride material can be a height 324-4, the second silicate material 306 can be a height 324-3, the second nitride material 308 can be a height 324-2, and the sacrificial layer 312 can be a height 324-1, that, when added together, results in the overall height 322.

While the example in association with FIG. 3 describes removing the sacrificial material prior to removal of the first silicate material 303 and the second silicate material 306, examples are not so limited. In at least one example, the first silicate material 303 and the second silicate material 306 can be removed prior to removal of the sacrificial material (e.g., the process described in association with FIG. 4 may be performed prior to the process described in association with FIG. 3).

Figure 4:
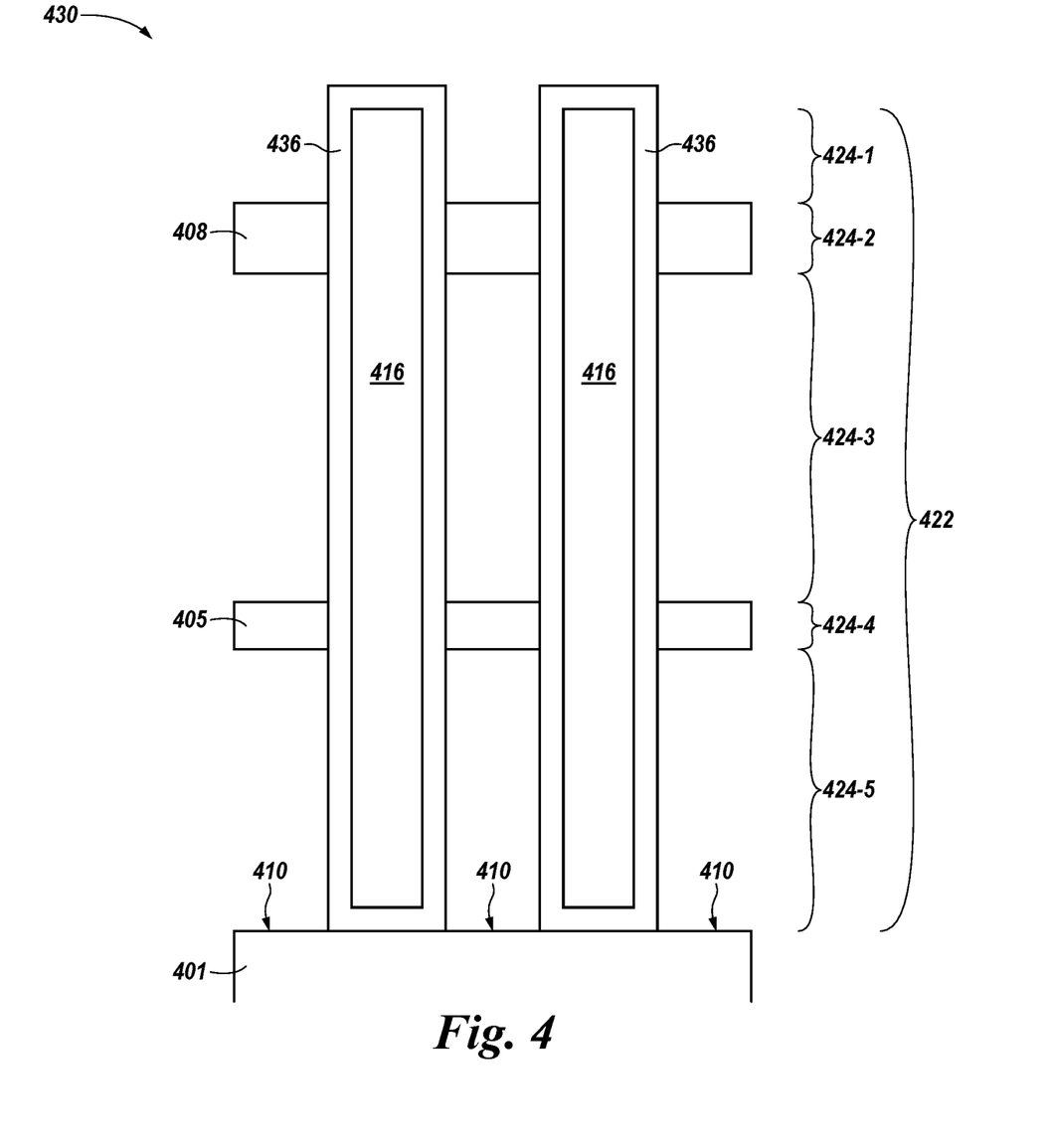

FIG. 4 illustrates a cross-sectional view 430 of a portion of an example memory device at a particular stage in the example fabrication sequence for formation of a capacitor in accordance with a number of embodiments of the present disclosure. FIG. 4 illustrates a structure of the portion of the example memory device at the particular stage following completion of the example fabrication sequence described in connection with FIGS. 1-3.

The first silicate material (e.g., BPSG, borosilicate glass (BSG), phosphosilicate glass (PSG), or TEOS) shown at 403 in FIG. 4 and the second silicate material (e.g., BPSG, BSG, PSG, or TEOS) shown at 406 in FIG. 4 have been removed from the portion of the example memory device. The first silicate material 403 and the second silicate material 406 may be removed with (via application of) a solvent that is selective for removing (e.g., dissolving) the first and second silicate materials from the memory device while not removing (e.g., leaving) other materials such that those materials remain in the memory device. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities. Removal of the first silicate material 403 and the second silicate material 406 may leave empty spaces (e.g., voids) in the structure of the memory device.

In contrast, the application of the selective solvent may leave the capacitor material 416 having the first electrode material 436 formed over an outer surface thereof remaining in the structure of the memory device. In addition, the first nitride material 405 and the second nitride material 408 may be left remaining following the application of the selective solvent, among other possible components or structural features that may remain in the structure of the memory device. The remaining first nitride material 405 and the remaining second nitride material 408 may function as a capacitor support structure, as described further in connection with FIG. 5, to provide support in view of the voids in the structure of the memory device.

As is illustrated in FIG. 4, a height 422 of the capacitor material 416 can include a height 424-4 and 424-2 of the first nitride material 405 and the second nitride material 408 along with heights 424-1, 424-3, and 424-5 of the removed sacrificial material, the second silicate material, and the first silicate material, respectively During at least one of the stages described in association with FIGS. 3-4, a portion of the capacitor material 416, along with the first electrode material 436 on an upper surface of the second nitride material 408, may have been removed (e.g., etched). More of the first electrode material 436 may have been formed (e.g., deposited) on upper surfaces of remaining portions of the capacitor material 416, such that the capacitor material 416 is covered on all surfaces with the first electrode material 436. An upper surface of the first electrode material 436 may, in a number of embodiments, be coplanar with the upper surface 409 of the second nitride material 408 such that a height 422 of the capacitor material 416 covered by the first electrode material 436 may be the same as the height of the original opening. As an example, the height 422 of the capacitor material 416 spans the height 424-5 of the removed first silicate material, the height 424-4 of the first nitride material 405, the height 424-3 of the removed second silicate material, the height 424-2 of the second nitride material 408, and the height 424-1 of the removed sacrificial material.

Figure 5:
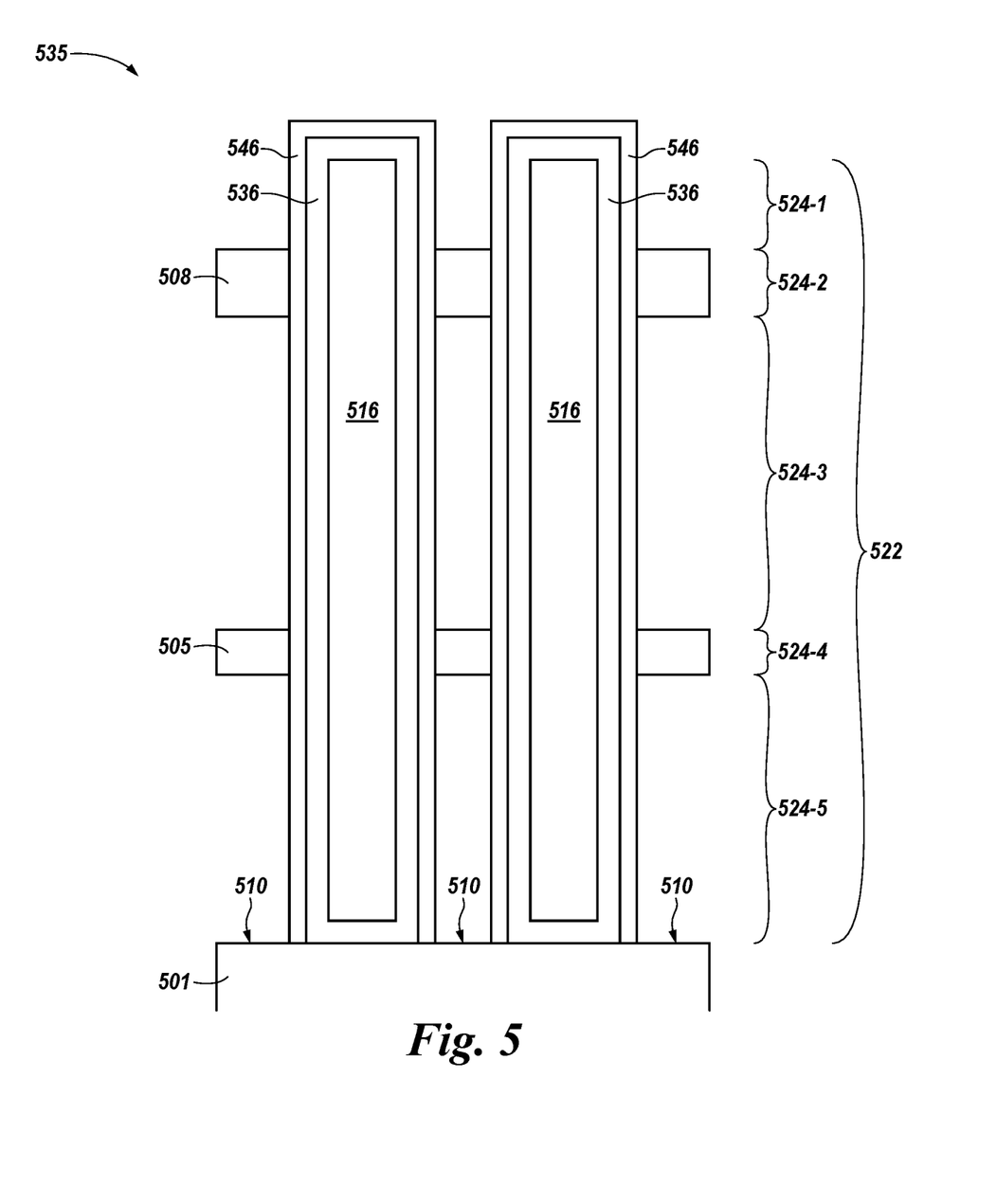

FIG. 5 illustrates a cross-sectional view 535 of a portion of an example memory device at a particular stage in the example fabrication sequence for formation of a capacitor in accordance with a number of embodiments of the present disclosure. FIG. 5 illustrates a structure of the portion of the example memory device following completion of the example fabrication sequence described in connection with FIGS. 1-4.

As shown, a dielectric material 546 has been formed (e.g., deposited) on an outer surface of the first electrode material 536. The dielectric material 546 may, in a number of embodiments, be formed from a surface 510 of the substrate material 501 to cover the outer surface, including an upper surface, of the first electrode material 536.

As is illustrated in FIG. 5, a height 522 of the capacitor material 516 can include a height 524-4 and 524-2 of the first nitride material 505 and the second nitride material 508 along with heights 524-1, 524-3, and 524-5 of the removed sacrificial material, the second silicate material, and the first silicate material, respectively.

Figure 6:
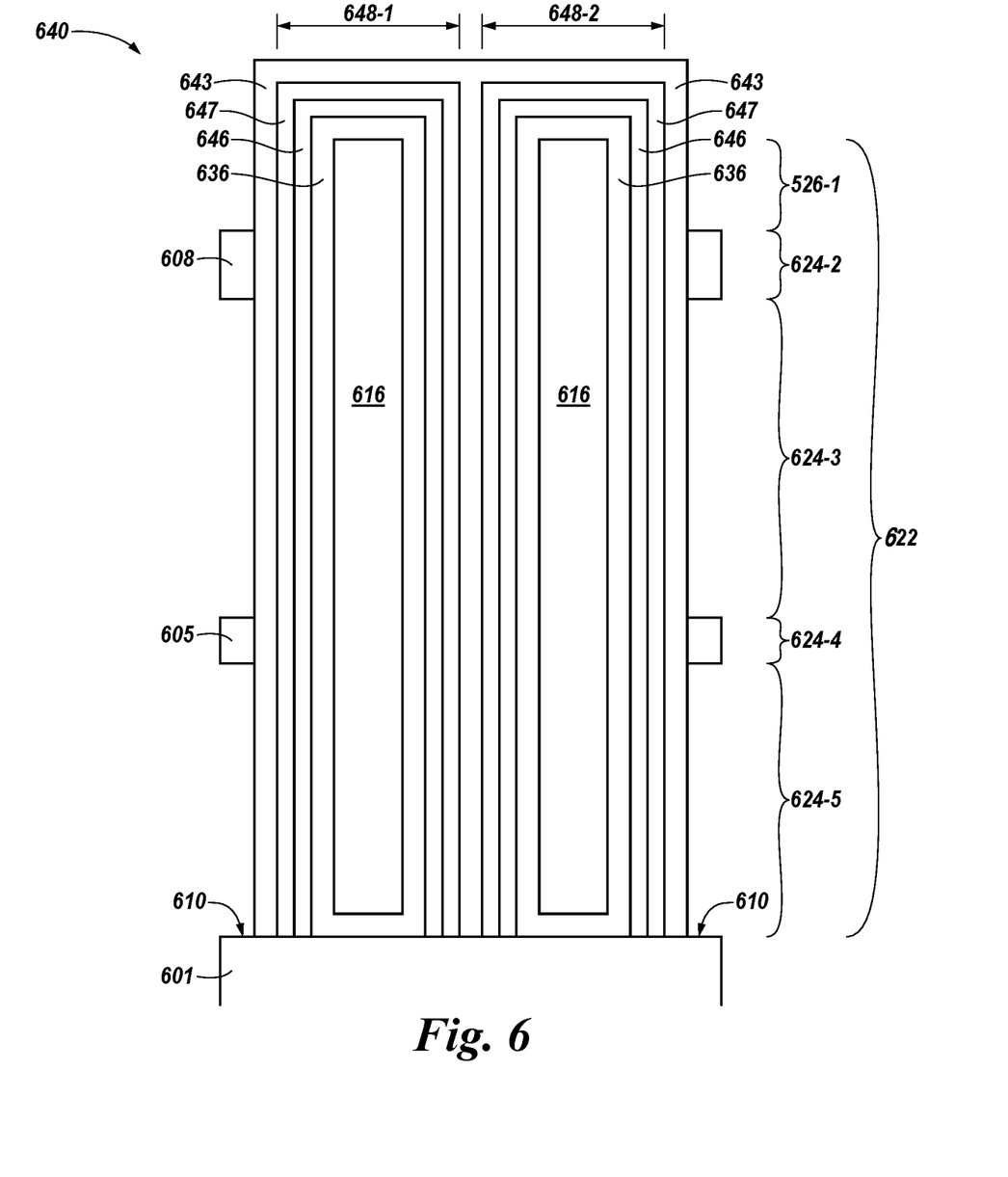

FIG. 6 illustrates a cross-sectional view 640 of a portion of an example memory device at a particular stage in the example fabrication sequence for formation of a capacitor in accordance with a number of embodiments of the present disclosure. FIG. 6 illustrates a structure of the portion of the example memory device following completion of the example fabrication sequence described in connection with FIGS. 1-5.

As shown, the dielectric material 646 has been formed (e.g., deposited) on an outer surface of the first electrode material 636. The dielectric material 646 may, in a number of embodiments, be formed from a surface 610 of the substrate material 601 to cover the outer surface, including an upper surface, of the first electrode material 636. A capacitor 648 may be subsequently formed, at least in part, by formation (e.g., deposition) of a second electrode material 647 on an outer surface of the dielectric material 646.

As is illustrated in FIG. 6, a height 622 of the capacitor material 616 can include a height 624-4 and 624-2 of the first nitride material 605 and the second nitride material 608 along with heights 624-1, 624-3, and 624-5 of the removed sacrificial material, the second silicate material, and the first silicate material, respectively.

The portion of the example memory device illustrated in FIG. 6 shows a first capacitor 648-1 and a second capacitor 648-2 indicated as widths in the structure and formed as just described. A height 622 of the capacitors 648-1, 648-2 may be higher than the height of the original opening due to the dielectric material 646 and second electrode material 647 being formed over the first electrode material 636. The example memory device illustrated in FIG. 6 shows a buffer material 643 that may be formed around and between the first and second capacitors 648-1, 648-2 as electrical insulation. The dielectric material 646, the second electrode material 647, and the buffer material 643 may be formed from any respective dielectric materials, conductive materials, and resistive materials and to any width (e.g., thickness) usable in association with formation of an operable capacitor for a semiconductor device.

The support structure is formed from the first nitride material 605 and the second nitride material 608, in addition to the underlying substrate material 601. The support structure may provide support to the first and second capacitors 648-1, 648-2 after the removal of the first and second silicate materials 303, 306 has left voids in the structure of the memory device and even after such voids may have been at least partially filled by the buffer material 643. The support structure formed from the first and second nitride materials 605, 608 is shown for simplicity to be attached only to the left side of the first electrode material 636 for capacitor 648-1 and the right side of the first electrode material 636 for capacitor 648-2. However, the support structure formed from the first and second nitride materials 605, 608 also may be on the opposite sides, or may be attached at four position or even surround, the first and second capacitors 648-1, 648-2. In a number of embodiments, the dielectric material 646, the second electrode material 647, and/or the buffer material 643 may surround the first electrode material 636 of the capacitors 648-1, 648-2 except at defined positions where the first and second nitride materials 605, 608 of the support structure are attached to the first electrode material 636.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of a capacitor bending and/or twisting during fabrication or use. By including a sacrificial material, as described herein, a particular height of the capacitor can be supported without sacrificing exposure of surface area of the capacitors. Further, the reduction in bending and/or twisting of the capacitors may reduce a possibility of unintended consequences, such as operational failure of the semiconductor device, need to replace parts, etc.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

Figure 7:
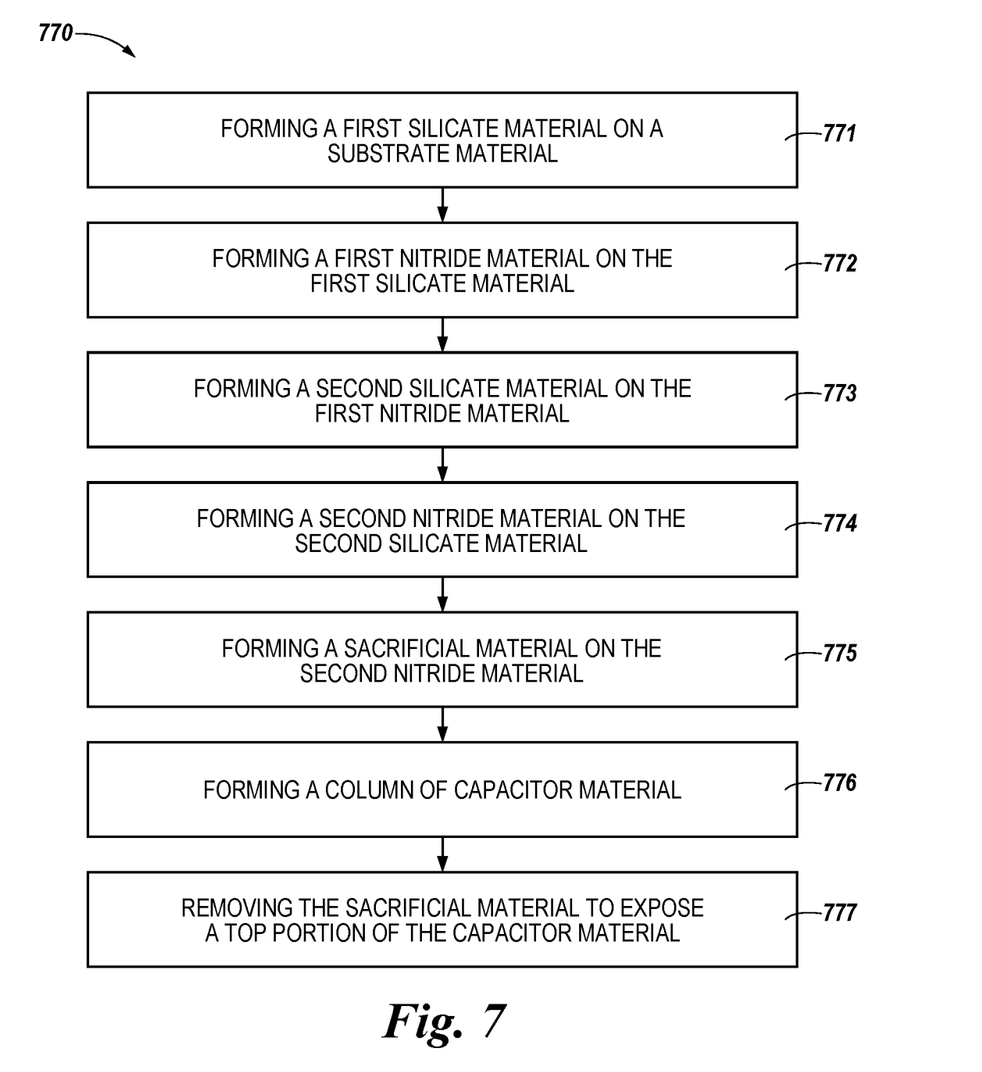
FIGS. 7-9 are flow diagrams of example methods for fabrication sequence for formation of a plurality of pillars of capacitors using a sacrificial layer in accordance with a number of embodiments of the present disclosure.

FIG. 7 is a flow diagram of an example method 770 for formation of a capacitor by using a sacrificial material in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 772, the method 770 may include forming a first silicate material on a substrate. The first silicate material may, in a number of embodiments, have been formed from a borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material, as described herein.

At block 772, the method 770 may include forming a first nitride material on the first silicate material. The first nitride material may be formed from a nitride material selected for dielectric or resistance properties. For example, one or more dielectric and/or resistor nitrides may be selected from boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material. The first nitride material may, in a number of embodiments, be deposited to a thickness in a range of from around 15 nm to around 30 nm above the surface of the first silicate material.

At block 773, the method 770 may include forming a second silicate material on the first nitride material. The second silicate material may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

At block 774, the method 770 may include forming a second nitride material on the second silicate material. Similar to the first nitride material, the second nitride material may be formed from a nitride material selected for dielectric or resistance properties. For example, one or more dielectric and/or resistor nitrides may be selected from BN, $SiN_X$, $Si_3N_4$, AlN, GN, TaN, $Ta_2N$, TiN, $Ti_2N$), and WN, $W_2N$, $WN_2$, among other possibilities, for formation of the second nitride material. In various embodiments, the first nitride material and the second nitride material may be formed from a same single nitride or a same mixture of nitrides or the first and second nitride materials each may be formed from a different single nitride or a different mixture of nitrides dependent upon, for example, various uses to which the nitrides may be applied. The second nitride material may, in a number of embodiments, be deposited to a thickness in a range of from around 80 nm to around 150 nm above the surface of the second silicate material.

At block 775, the method 770 may include forming a sacrificial material on the second nitride material. In at least one embodiment, the sacrificial material may be a third nitride material. In at least one embodiment, the sacrificial material can be a different nitride material than the second nitride material. In at least one embodiment, the sacrificial material can be a same nitride material than the second nitride material. Similar to the first nitride material and the second nitride material, the sacrificial material may be formed from a nitride material selected for dielectric or resistance properties. For example, one or more dielectric and/or resistor nitrides may be selected from BN, $SiN_X$, $Si_3N_4$, AlN, GN, TaN, $Ta_2N$, TiN, $Ti_2N$), and WN, $W_2N$, $WN_2$, among other possibilities, for formation of the sacrificial material.

At block 776, the method 770 may include forming a column of capacitor material. At block 777, the method 770 may include removing the sacrificial material to expose a top portion of the capacitor material. The method 770 may further include forming the first and second silicate materials from different silicate materials (e.g., as described in connection with FIG. 1).

Figure 8:
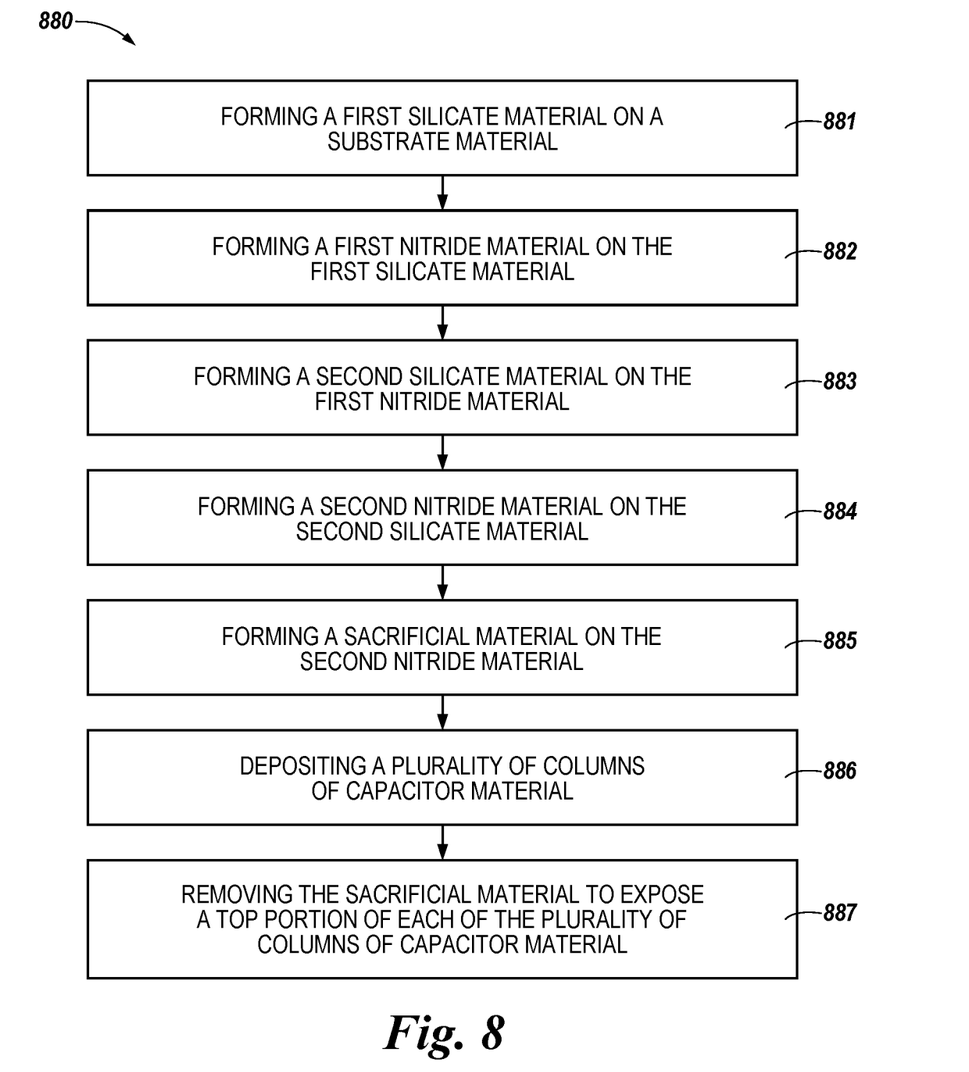

FIG. 8 is a flow diagram of an example method 880 for formation of a capacitor by using a sacrificial material in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 881, the method 880 may include forming a first silicate material on a substrate. The first silicate material may, in a number of embodiments, have been formed from a borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities.

At block 882, the method 880 may include forming a first nitride material on the first silicate material. The first nitride material may be formed from a nitride material selected for dielectric or resistance properties. For example, one or more dielectric and/or resistor nitrides may be selected from boron nitride (BN), silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material. The first nitride material may, in a number of embodiments, be deposited to a thickness in a range of from around 15 nm to around 30 nm above the surface of the first silicate material.

At block 883, the method 880 may include forming a second silicate material on the first nitride material. The second silicate material may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

At block 884, the method 880 may include forming a second nitride material on the second silicate material. Similar to the first nitride material, the second nitride material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the second nitride material.

At block 885, the method 880 may include forming a sacrificial material on the second nitride material. In at least one embodiment, the sacrificial material may be a third nitride material. In at least one embodiment, the sacrificial material can be a different nitride material than the second nitride material. In at least one embodiment, the sacrificial material can be a same nitride material than the second nitride material. Similar to the first nitride material and the second nitride material, the sacrificial material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the sacrificial material.

At block 886, the method 880 may include forming a plurality of columns of capacitor material. As an example, a plurality of columns can be etched out of the first silicate material, the first nitride material, the second silicate material, the second nitride material, and the sacrificial material, resulting in a plurality of openings in the materials. A capacitor material can be deposited within the etched openings, resulting in the plurality of columns of capacitor material.

At block 887, the method 880 may include removing the sacrificial material to expose a top portion of each of the plurality of columns of capacitor material. Removing the sacrificial material can increase a surface area of exposure of the plurality of columns of capacitor material, thereby increasing the functionality of the capacitor material and/or a capacitor formed from the capacitor material of a memory device.

Figure 9:
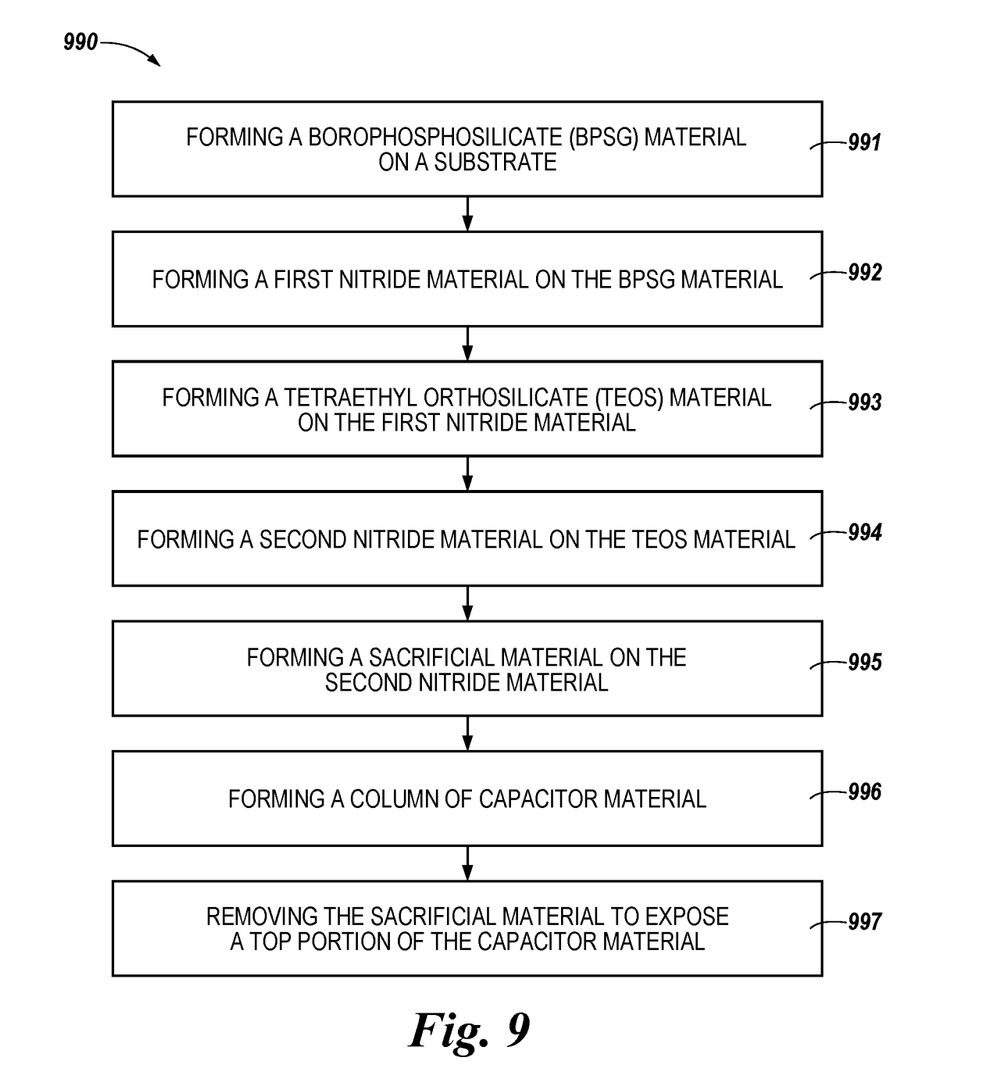

FIG. 9 is a flow diagram of an example method 990 for formation of a capacitor by using a sacrificial material in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 991, the method 990 may include forming a borophosphosilicate glass (BPSG) material on a substrate. The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities.

At block 992, the method 990 may include forming a first nitride material on the BPSG material. The first nitride material may be formed from a nitride material selected for dielectric or resistance properties. For example, one or more dielectric and/or resistor nitrides may be selected from boron nitride (BN), silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material. The first nitride material may, in a number of embodiments, be deposited to a thickness in a range of from around 15 nm to around 30 nm above the surface of the first silicate material.

At block 993, the method 990 may include forming a tetraethyl orthosilicate ($Si(OC_2H_5)_4$) (TEOS) material on the first nitride material. TEOS may be formed as an ethyl ester of orthosilicic acid ($Si(OH)_4$), among other possibilities.

At block 994, the method 990 may include forming a second nitride material on the TEOS material. Similar to the first nitride material, the second nitride material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the second nitride material.

At block 995, the method 990 may include forming a sacrificial material on the second nitride material. In at least one embodiment, the sacrificial material may be a third nitride material. In at least one embodiment, the sacrificial material can be a different nitride material than the second nitride material. In at least one embodiment, the sacrificial material can be a same nitride material than the second nitride material. Similar to the first nitride material and the second nitride material, the sacrificial material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the sacrificial material.

At block 996, the method 990 may include forming a column of capacitor material. As an example, a column can be etched out of the BPSG material, the first nitride material, the TEOS material, the second nitride material, and the sacrificial material, resulting in an opening in the materials. A capacitor material can be deposited within the etched opening, resulting in the column of capacitor material.

At block 997, the method 990 may include removing the sacrificial material to expose a top portion of the column of capacitor material. Removing the sacrificial material can increase a surface area of exposure of the column of capacitor material, thereby increasing the functionality of the capacitor material and/or a capacitor formed from the capacitor material of a memory device.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to formation of a capacitor using a sacrificial material have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to use of a sacrificial material in formation of a capacitor than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    forming a first silicate material on a substrate;
    forming a first nitride material on the first silicate material;
    forming a second silicate material on the first nitride material;
    forming a second nitride material on the second silicate material;
    forming a sacrificial material on a top surface of the second nitride material;
    forming a column of capacitor material through the first silicate material, the first nitride material, the second silicate material, the second nitride material, and the sacrificial material, wherein the column of capacitor material is formed to at least a height of the initially formed sacrificial material;
    removing the sacrificial material to expose a side surface of a top portion of the column of capacitor material;
    removing the first silicate material and the second silicate material to expose a top side and a bottom side of both the first nitride material and the second nitride material and forming a first electrode material, a dielectric material, a second electrode material, and a buffer material over the column of capacitor material.

2. The method of claim 1, wherein the combination of the first silicate material, the first nitride material, the second silicate material, the second nitride material, and the sacrificial material is formed to a height of greater than 10,000 Angstroms.

3. The method of claim 2, wherein the first silicate material and the second silicate material make up at least 8,600 Angstroms of the height greater than 10,000 Angstroms.

4. The method of claim 1, wherein a height of the first silicate material is between 4,000 and 6,000 Angstroms.

5. The method of claim 1, wherein a height of the first nitride material is between 100 and 400 Angstroms.

6. The method of claim 1, wherein a height of the second silicate material is between 2,000 and 5,000 Angstroms.

7. The method of claim 1, wherein a height of the second nitride material is between 100 and 1,500 Angstroms.

8. The method of claim 1, wherein a height of the sacrificial material is between 100 and 1,500 Angstroms.

9. The method of claim 1, wherein the first nitride material is between the sacrificial material and the first silicate material.

10. The method of claim 1, wherein at least one of the first silicate material and the second silicate material comprises one of a borophosphosilicate glass (BPSG) material and a TEOS material.

11. The method of claim 1, wherein the sacrificial material is a nitride material.

12. The method of claim 1, wherein the sacrificial material is a silicate material.

13. A method, comprising:
forming a first silicate material on a substrate;
forming a first nitride material on the first silicate material;
forming a second silicate material on the first nitride material;
forming a second nitride material between the second silicate material and a sacrificial material, wherein the sacrificial material includes a nitride material;
forming the sacrificial material on a top surface of the second nitride material;
depositing a plurality of columns of capacitor material within the formed first silicate material, the first nitride material, the second silicate material, the second nitride material, and the sacrificial material, wherein the plurality of columns of capacitor material is formed to a height above a height of the second nitride material; and
removing the sacrificial material to expose a side surface of a top portion of each of the plurality of columns of capacitor material;
removing the first silicate material and the second silicate material; and
forming a first electrode material, a dielectric material, a second electrode material, and a buffer material over the plurality of columns of capacitor material.

14. The method of claim 13, wherein removing the sacrificial material exposes the side portion of the column of capacitor material along a width of at least 700 Angstroms.

15. The method of claim 13, wherein the first silicate material is between the substrate and the first nitride material.

16. The method of claim 13, wherein the second silicate material is between the first nitride material and the second nitride material.

17. The method of claim 13 wherein the sacrificial material is deposited on the second nitride material.

18. The method of claim 13, wherein removing the sacrificial material comprises etching the sacrificial material.

19. The method of claim 13, wherein the sacrificial material includes one of TiSiN and TiN.

20. The method of claim 13, further comprising removing the first silicate material and the second silicate material.

21. The method of claim 13, wherein:
at least one of the first silicate material and the second silicate material is formed from a borophosphosilicate glass (BPSG) material including a silicon compound ($SiO_2$) doped with a boron compound ($B_2O_3$) and a phosphorus compound ($P_2O_5$);
at least one of the first silicate material and the second silicate material is formed from a tetraethyl orthosilicate (TEOS) material.

22. A method, comprising:
forming a borophosphosilicate glass (BPSG) material on a substrate;
forming a first nitride material on the BPSG material;
forming a tetraethyl orthosilicate (TEOS) material on the first nitride material;
forming a second nitride material between the TEOS material and a sacrificial material, wherein the sacrificial material comprises a nitride material;
forming the sacrificial material on a top surface of the second nitride material;
forming a column of capacitor material within the formed BPSG material, the first nitride material, the TEOS material, the second nitride material, and the sacrificial material, wherein:
the sacrificial material is along a side of the column of capacitor material; and
the column of capacitor material is formed to at least a height of the sacrificial material;
removing the sacrificial material to expose a side surface of a top portion of the column of capacitor material;
removing, with a selective solvent, the BPSG material and the TEOS material, wherein the first and second nitride materials remain as a capacitor support structure and a top side and a bottom side of the first nitride material and the second nitride material are exposed; and
forming a first electrode material, a dielectric material, a second electrode material, and a buffer material over the column of capacitor material.

23. The method of claim 22, further comprising:
removing, with a selective solvent, the first silicate material and the second silicate material;
leaving the capacitor material having the first electrode material formed over an outer surface thereof; and
leaving the first and second nitride materials as a capacitor support structure.

24. A portion of a memory device formed by the method of claim 22, wherein:
the memory device comprises at least one memory cell that includes:
at least one capacitor, as a data storage element, that is supported by the capacitor support structure; and
at least one access device coupled to the at least one capacitor.

* * * * *